US010020346B2

(12) United States Patent
Bedau (10) Patent No.: US 10,020,346 B2
(45) Date of Patent: Jul. 10, 2018

(54) RESISTIVE MEMORY DEVICE BY SUBSTRATE REDUCTION

(71) Applicant: Western Digital Technologies, Inc., Irvine, CA (US)

(72) Inventor: Daniel Bedau, San Jose, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 15/162,332

(22) Filed: May 23, 2016

(65) Prior Publication Data

US 2017/0338281 A1    Nov. 23, 2017

(51) Int. Cl.
*H01L 27/24* (2006.01)
*H01L 45/00* (2006.01)
*H01L 23/528* (2006.01)

(52) U.S. Cl.
CPC ........ *H01L 27/2463* (2013.01); *H01L 23/528* (2013.01); *H01L 45/08* (2013.01); *H01L 45/1206* (2013.01); *H01L 45/1226* (2013.01); *H01L 45/146* (2013.01); *H01L 45/147* (2013.01); *H01L 45/1608* (2013.01)

(58) Field of Classification Search
CPC ............. H01L 27/2436; H01L 45/1206; H01L 45/1226; H01L 45/146; H01L 45/147; H01L 45/165
See application file for complete search history.

(56) References Cited

U.S. PATENT DOCUMENTS

| 7,200,021 | B2* | 4/2007 | Raghuram | ............. | B82Y 10/00 |
| | | | | | 257/686 |
| 7,566,628 | B2 | 7/2009 | Liao et al. | | |
| 7,615,769 | B2 | 11/2009 | Kim | | |
| 7,723,714 | B2* | 5/2010 | Karg | ....................... | H01L 45/08 |
| | | | | | 257/3 |
| 8,258,038 | B2 | 9/2012 | Nozawa | | |
| 8,385,102 | B2 | 2/2013 | Kiao et al. | | |

(Continued)

FOREIGN PATENT DOCUMENTS

JP    2008235704 A    * 10/2008

OTHER PUBLICATIONS

Ungureanu et al., Three-terminal resistive switching memory in a transparent vertical-configuration device, Applied Physics Letters, 2014, 6 pages, vol. 104, No. 013503, AIP Publishing. Located at: http://www.nanogune.eu/publications/2014?idPublication=2807.

*Primary Examiner* — Tom Thomas
*Assistant Examiner* — Vincent Wall
(74) *Attorney, Agent, or Firm* — Patterson & Sheridan, LLP; Steven Versteeg (57) ABSTRACT

To provide enhanced data storage devices and systems, various systems, architectures, apparatuses, and methods, are provided herein. In a first example, a resistive memory device is provided. The resistive memory device comprises a substrate, and an active region having resistance properties that can be modified to store one or more data bits, the active region comprising region of the substrate with a chemically altered reduction level to establish a resistive memory property in the substrate. The resistive memory device comprises terminals formed into the substrate and configured to couple the active region to associated electrical contacts.

6 Claims, 6 Drawing Sheets

(56) References Cited

U.S. PATENT DOCUMENTS

| | | |
|---|---|---|
| 8,686,389 B1 | 4/2014 | Wang et al. |
| 8,835,890 B2 | 9/2014 | Hsueh et al. |
| 2003/0132458 A1* | 7/2003 | Van Brocklin ....... H01L 27/101 257/209 |
| 2006/0239060 A1* | 10/2006 | Shimada ................ G11C 11/22 365/145 |
| 2007/0004224 A1* | 1/2007 | Currie ................ H01L 21/3141 438/778 |
| 2008/0203377 A1* | 8/2008 | Choi .................... H01L 45/085 257/5 |
| 2010/0123222 A1* | 5/2010 | Ivanova-Hristova .. B82Y 10/00 257/632 |
| 2010/0221896 A1 | 9/2010 | Sandoval |
| 2013/0161583 A1 | 6/2013 | Blomme et al. |

* cited by examiner

RESISTIVE MEMORY DEVICE BY SUBSTRATE REDUCTION

TECHNICAL FIELD

Aspects of the disclosure are related to the field of data storage and resistive random access memory in data storage devices.

TECHNICAL BACKGROUND

Computer and network data systems such as personal computers, workstations, server systems, and cloud storage systems, typically include data storage devices for storing and retrieving data. These data storage devices can include hard disk drives (HDDs), solid state storage drives (SSDs), tape storage devices, optical storage drives, hybrid storage devices that include both rotating and solid state data storage elements, and other mass storage devices. Recently, new storage technologies have been developed which employ resistive memory elements. These resistive memory elements can include resistive random-access memory (RRAM or ReRAM), which are types of non-volatile random access memory that store data by altering a resistance of a solid-state material. However, ReRAM elements can be difficult to manufacture and incorporate into memory devices. Moreover, arrays of ReRAM employ two-terminal memory elements which do not integrate well into arrayed architectures.

OVERVIEW

To provide enhanced data storage devices and systems, various systems, architectures, apparatuses, and methods, are provided herein. In a first example, a resistive memory device is provided. The resistive memory device comprises a substrate, and an active region having resistance properties that can be modified to store one or more data bits, the active region comprising region of the substrate with a chemically altered reduction level to establish a resistive memory property in the substrate. The active region device comprises terminals formed into the substrate and configured to couple the active region to associated electrical contacts.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

High-density storage devices employ a variety of storage technologies. In the past, magnetic storage devices have been employed, such as hard disk drives with rotating magnetic media. More recently, solid state storage devices, such as flash drives employing NAND flash or other semiconductor-based memory technologies have become popular as associated densities have increased. Other storage technologies, such as optical and non-rotating magnetic technologies are also employed. However, resistive memory technologies have become possible using new materials which have alterable resistance properties, such as electrical resistances, that persist after application of an electric current. These resistive memory devices include memristors and other related devices. Memristors typically comprise two-terminal electrical components which relate electric charge to magnetic flux linkage, where an electrical resistance of a memristor depends upon a previous electrical current passed by the memristor. Although memristors can be incorporated into non-volatile memories, it has been difficult to incorporate arrays of these memristors into storage devices, in part due to difficulty in achieving addressable memory arrays.

As will be seen herein, various enhanced architectures and devices employ resistive memory devices. Two-terminal devices are described herein with an active region and two associated terminals. In some examples, three-terminal devices that include gate, source, and drain terminals, are described. The gate terminal can be employed to alter resistance properties of an active channel between the source and drain terminals. These three-terminal devices can be referred to as resistive random-access memory (ReRAM) devices or ReRAM elements. As discussed below, these resistive memory elements have two or three terminals and include resistive memory material in an active channel portion between source and drain terminals. The resistive memory material comprises flux linkage-controlled resistor material, and the elements described herein can be formed from various metal oxides through reduction or oxidation processes.

Figure 1:
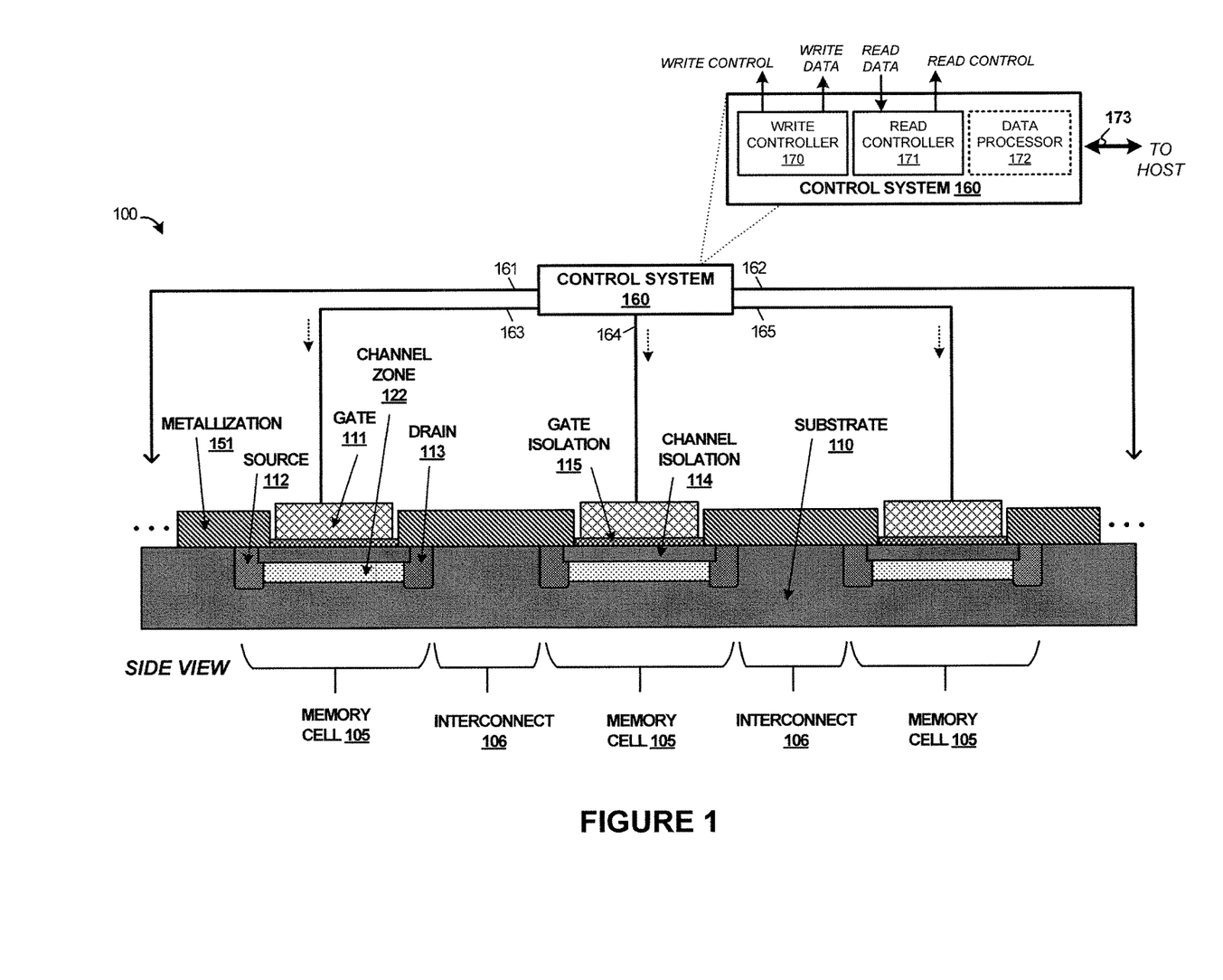
FIG. 1 is a system diagram illustrating a resistive memory array.

In a first example shown in FIG. 1, one or more resistive memory devices are included in an array, although each device can be included as a separate memory device. FIG. 1 is a system diagram illustrating a cross-sectional side view of resistive memory storage array 100. Array 100 illustrates an example linear array of resistive memory elements, each with an associated memory cells 105. Arrays of resistive memory can be formed horizontally on a base wafer into a two-dimensional array. Arrays of resistive memory can also be formed vertically from a base wafer to form three-dimensional arrays. In three-dimensional examples, wordlines can be vertically arranged with row interconnect shared among one or more devices of a particular layer. The techniques discussed herein apply to both horizontally and vertically arranged resistive memory arrays.

Although only three example resistive memory elements are included in FIG. 1, it should be understood that any number can be arrayed into a liner arrangement as shown in FIG. 1. Moreover, several layers of the arrangement in FIG. 1 can be achieved by repeated formation of the substrate layer and associated device features. Each resistive memory element comprises a three-terminal configuration that includes gate 111, source 112, and drain 113. Each resistive memory element is interconnected with adjacent resistive memory elements via interconnect elements 106. Control system 160 is included to control each of the resistive memory elements for reading and writing of data bits into associated memory cells.

Turning first to each resistive memory element, an included memory cell 105 comprises non-volatile memory (NVM) material in an associated channel zone 122. NVM material comprises resistive memory material, with resistance properties, such as electrical resistances, of the resistive memory material able to be altered using at least an associated gate 111. As mentioned above, each ReRAM element includes gate terminal 111, source terminal 112, and drain terminal 113. Each resistive memory element is interconnected by at least metallization 151 which forms conductive links between each resistive memory element.

Memory layers are formed into substrate 110. Substrate 110 can be formed onto one or more logic and metallization layers, which can comprise semiconductor-based logic and metal interconnect of a logic circuit, processor, control system, or other elements which can at least control the elements of memory layers formed on top of the semiconductor layers. For example, when a semiconductor wafer is employed for creation of logic circuitry and associated interconnect, then one or more layers of resistive memory array 100 can be formed on top of logic circuitry and associated interconnect using techniques found in semiconductor wafer processing and microfabrication, such as photo-lithography, diffusing, deposition, epitaxial growth, etching, annealing, and ion implanting, among others.

Substrate 110 comprises a metal oxide material which isolates individual memory cells from each other. Each channel zone 122 can be formed into the substrate by a reduction process. The reduction process converts a region of the substrate from having an isolating property to having a resistive memory property. A gate structure can be formed on top of each memory cell to allow for control of the resistive properties of the associated memory cell. The gate structure can be formed on one or more further layers, such as channel isolation layer 114 and gate isolation layer 115.

Metallization 151 can be included to interconnect each resistive memory element, with source terminals and drain terminals coupled in a series fashion. Metallization 151 comprises a high conductivity inactive material. In some examples, metallization 151 comprises metal ions implanted into intervening material between resistive memory cells. In other examples, metallization 151 comprises deposited metal or conductive material.

In write operations, control system 160 can apply a voltage individually to any of the gates over links 163-165 which will alter resistance properties of NVM material in the associated channel zones 122. Altered resistance properties, such as electrical resistances, can be used to store data bits in memory cells, with values of the resistance properties indicating various bit values, such as a binary '1' or '0'— although multi-level bit logic can be employed to store many bits per memory cell depending upon the resistance properties.

In read operations, control system 160 can measure a series resistance across all of the memory cells 105 using links 161-162. This series resistance might not indicate the data stored by individual memory cells, as all three memory cells in this example would be measured in series. Control system 160 can also measure individual memory cells by measuring resistances through individual gates, such as by measuring a resistance across link 161 and link 163. Further resistance measurements can be employed, such as across links 161/164 and links 162/165. These various resistance measurements can be processed to identify data bits stored in each memory cell, which can include comparing the series resistance of the entire array to individual gate-selected resistance measurements.

Turning now to control system 160, FIG. 1 illustrates a control system or controller which can be employed to interface with one or more resistive memory arrays, such as array 100. Control system 160 is representative of any logic, control systems, or collection of logic and systems in which the various resistive memory read, write, and other operational architectures, scenarios, and processes disclosed herein may be implemented. For example, control system 160 can be employed in any of the sublayer logic onto which memory array 100 is formed. Features of control system 160 can be incorporated into further devices and systems, such as external controllers, logic modules, microprocessors, computing devices, or distributed computing devices, as well as any variation or combination thereof.

Control system 160 may be implemented as a single apparatus, system, or device or may be implemented in a distributed manner as multiple apparatuses, systems, or devices. For example, control system 160 can comprise one or more application-specific integrated circuits (ASICs), field-programmable gate arrays (FPGA), or discrete logic and associated circuitry, including combinations thereof. Although not shown in FIG. 1, control system 160 can include communication interfaces, network interfaces, user interfaces, and other elements for communicating with a host system over communication link 173. Control system 160 may optionally include additional devices, features, or functionality not discussed for purposes of brevity.

Control system 160 can also comprise or communicate with one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, resistive memory devices, ReRAM devices, optical disks, flash memory, virtual memory and non-virtual memory, magnetic cassettes, magnetic tape, magnetic disk storage or other magnetic storage devices, or any other suitable storage media.

Control system 160 includes various controller portions to control resistive memory arrays, namely write controller 170, read controller 171, and optionally data processor 172. Write controller 170 writes data into resistive memory devices discussed herein, such as by using gate features or gate terminals of resistive memory devices. Write control signaling can include bitlines and wordlines which are used to uniquely address a resistive memory device to write data into that resistive memory device. In some examples, only entire wordlines are addressable and thus an entire wordline of data is written into associated resistive memory devices simultaneously. Read controller 171 reads data stored in resistive memory devices. The read process can include measuring resistance properties of ones of the resistive memory devices. For example, read controller 171 is communicatively coupled to ends of wordlines or the resistive memory devices and measure at least a series resistance property of each of the wordlines. Read controller 171 can also be communicatively coupled to ends of the bitlines of the resistive memory devices and individually select ones of the bitlines to measure an associated resistance property of a subset of the resistive memory devices as a series resistance property through a bitline-selected gate portion and a selected wordline. Read controller 171 can determine data stored by ones of the resistive memory devices by at least processing the series resistance property of a wordline that contains the at least the resistive memory devices being read and a resistance property of a subset of the resistive memory devices being read. Other techniques can be employed to measure and read data from each of the resistive memory devices. Data processor 172 is optionally included to further process data, such as to arrange data into logical arrangements including words, pages, and the like, before transfer to a host over link 173. Data processor 172 can also be configured to perform encoding/decoding or encryption/decryption operations with respect to the data stored in an associated resistive memory array.

Figure 2:
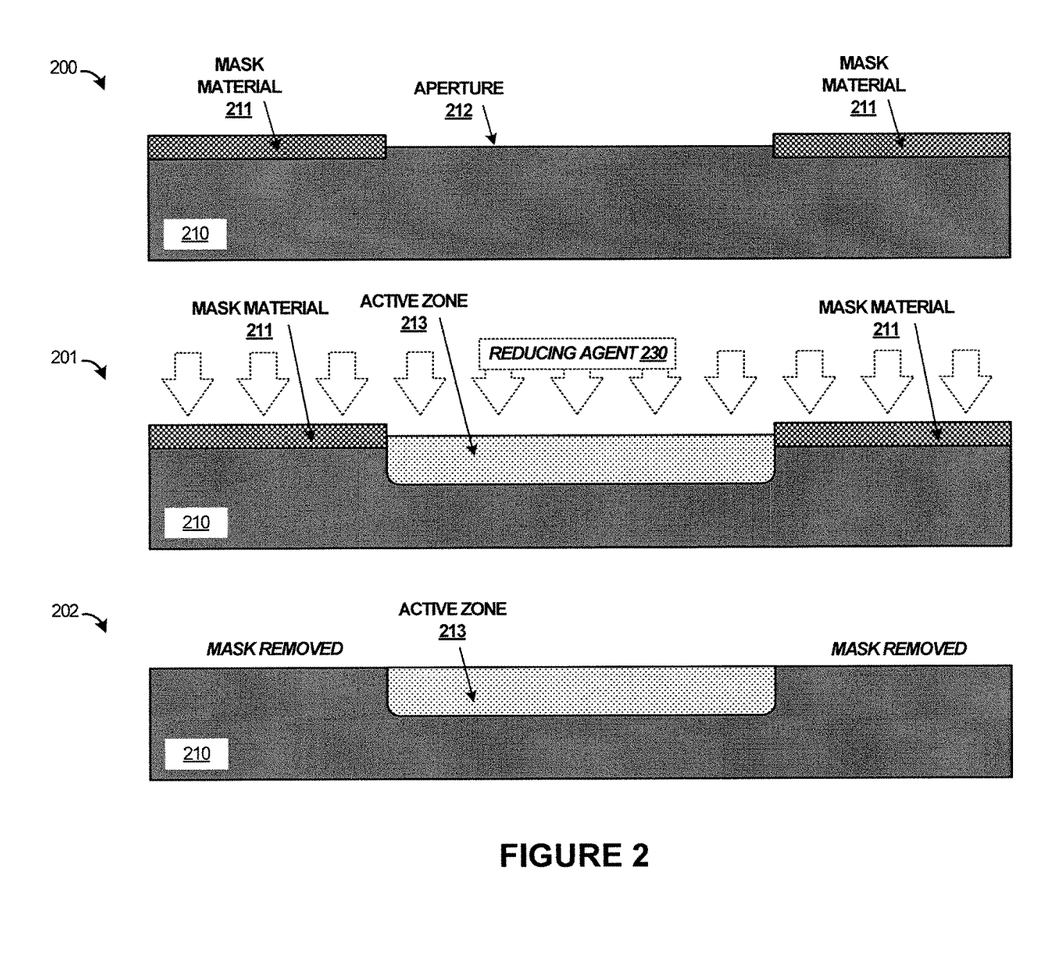
FIG. 2 illustrates manufacture of resistive memory elements.
Figure 3A:
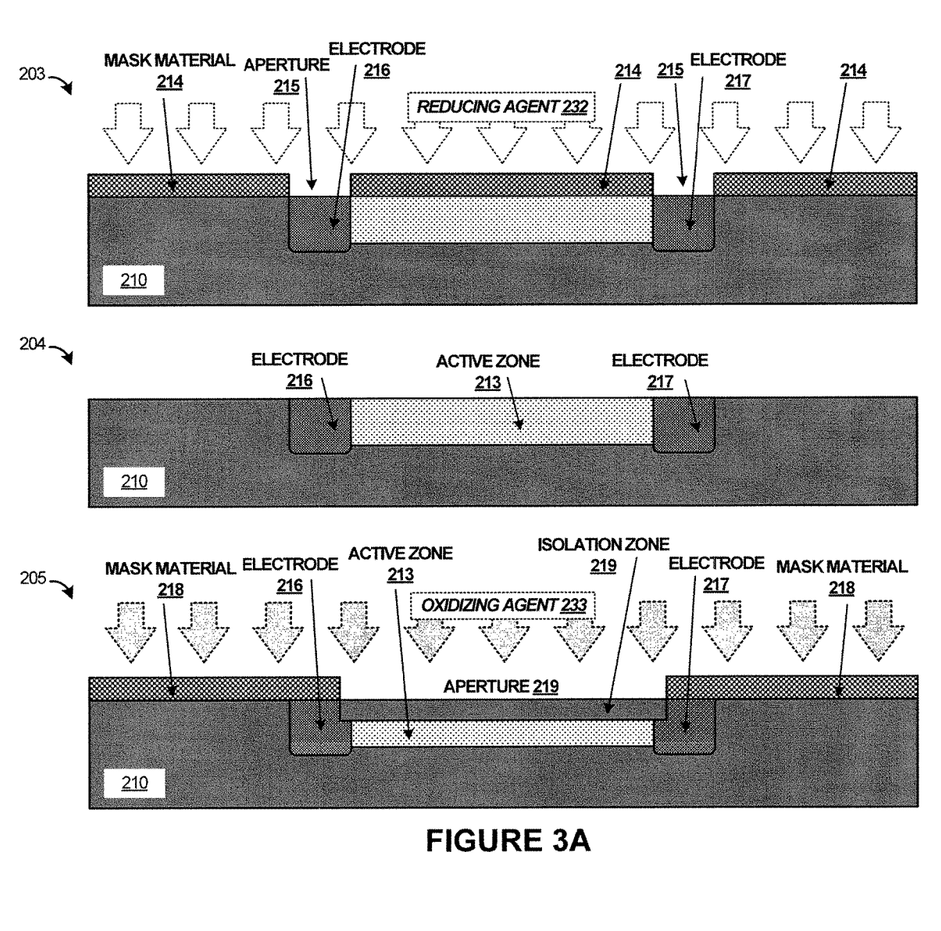
FIG. 3A illustrates manufacture of resistive memory elements.
Figure 3B:
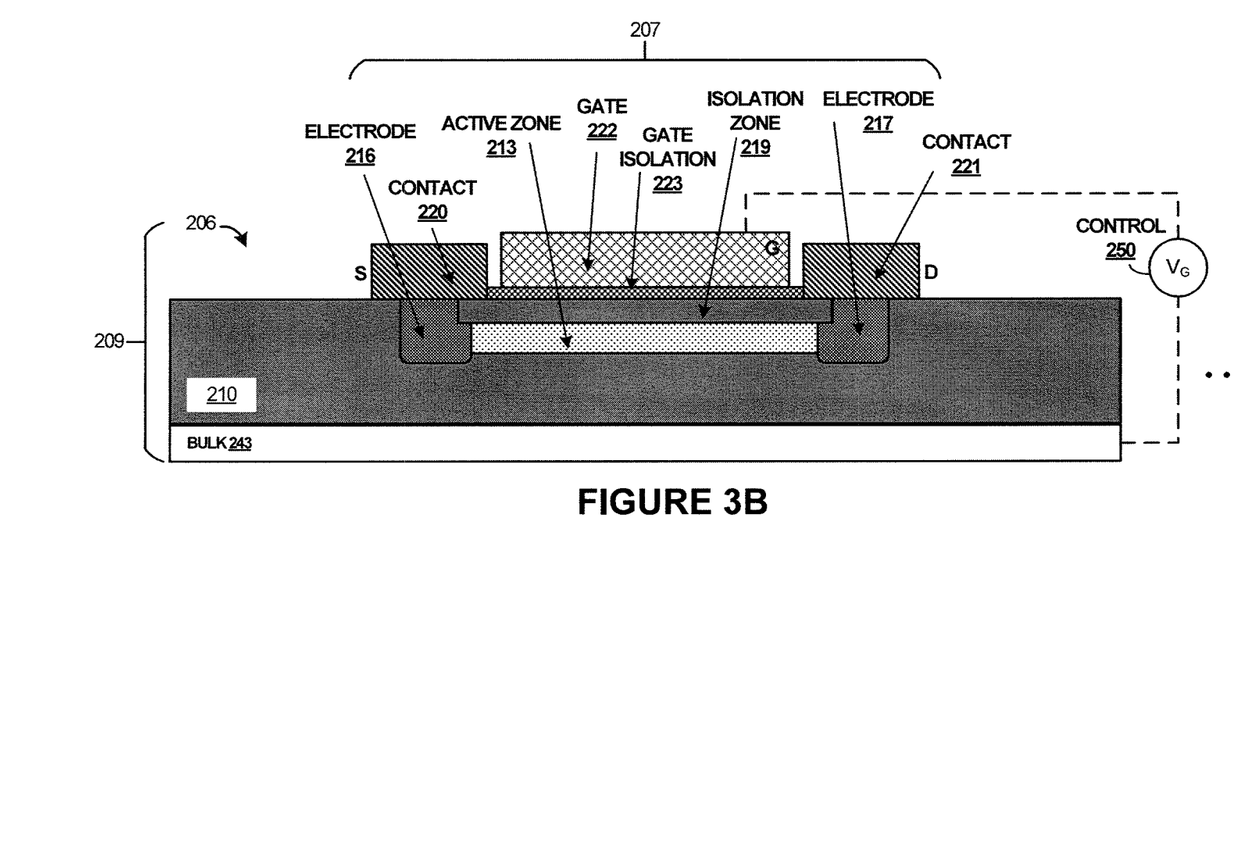
FIG. 3B illustrates manufacture of resistive memory elements.
Figure 4:
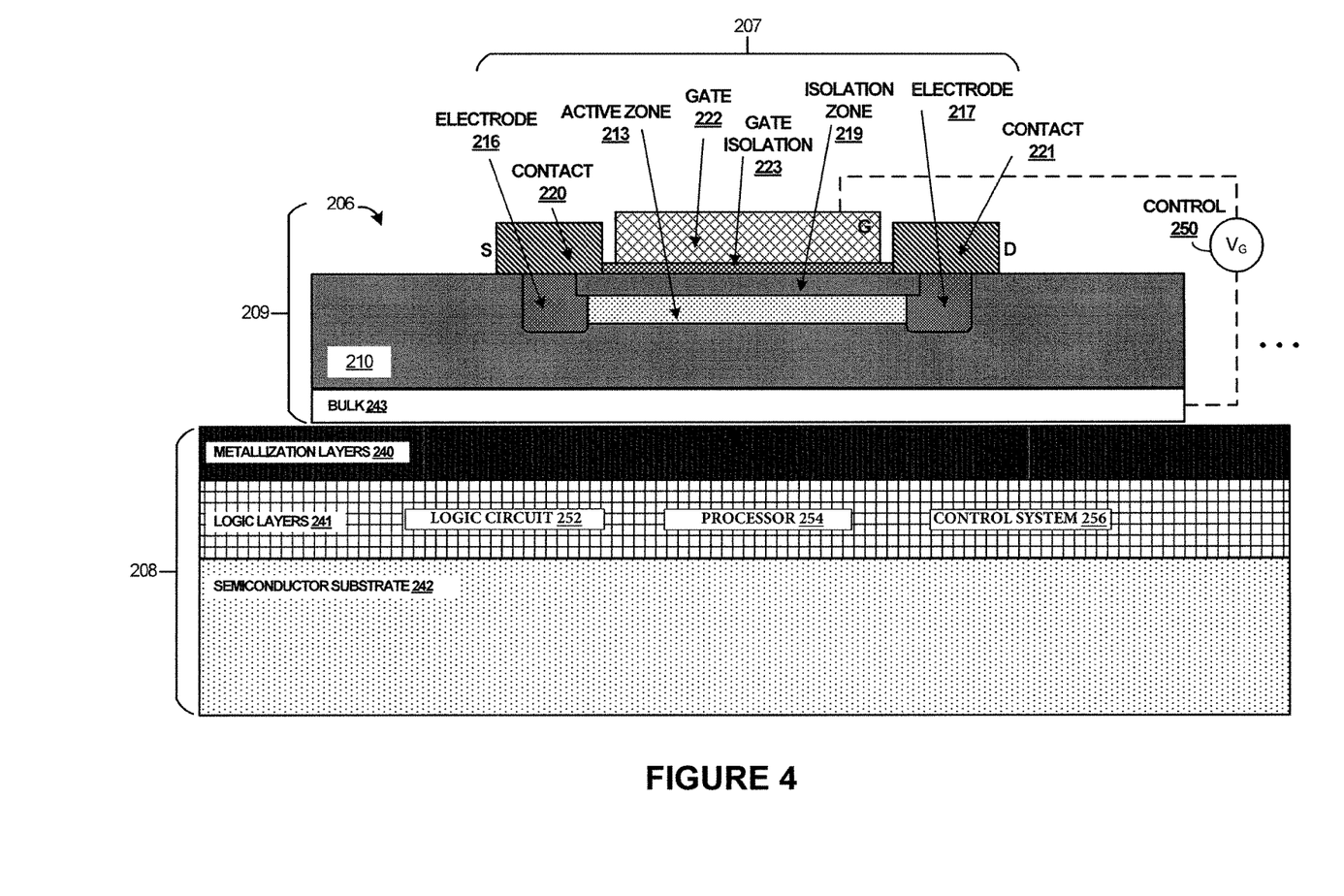
FIG. 4 illustrates manufacture of resistive memory elements.

FIGS. 2-4 each show various cross-sectional side views of manufacturing processes for forming a resistive memory array, such as the memory array shown in FIG. 1, although variations are possible. It should be noted that the thicknesses and other dimensions of the various elements, layers, and materials employed herein can depend on properties of the specific materials employed, properties desired for the devices, manufacturing techniques employed, among other considerations. Also, the gate elements can be omitted in some examples, such as when forming two-terminal devices instead of three-terminal devices.

Beginning with FIG. 2, configuration 200 shows substrate 210. Substrate 210 is generally formed initially in the formation of a memory device or memory array, and can be formed on one or more semiconductor logic or metallization layers. The resistive memory elements are built into and onto substrate 210, with many layers of memory arrays possible with repeating layers or three-dimensional vertical arrangements which rotate the memory structures into a vertical orientation to form arrays.

Substrate 210 comprises a metal oxide material, such as hafnium oxides ($HfO_x$), tantalum oxides ($TaO_y$), or any other suitable metal oxide, where 'x' and 'y' can vary based on levels of oxidation and reduction of the base chemical/metal. These metal oxides can comprise 'binary' metal oxides. Binary metal oxides discussed herein have properties that can be altered depending upon a level of oxidation, specifically resistive memory properties, conductive properties, or insulating properties. In a first oxidation state comprising a low oxidation state or highly reduced state, the binary metal oxide exhibits electrically conductive properties. In a second oxidation state comprising a high oxidation state or low reduction state, the binary metal oxide exhibits electrically insulating properties. In a third range, or middle state, the binary metal oxide will exhibit resistive memory properties which can be altered to store bits of data. When employed as in resistive memory, these materials can comprise flux linkage controlled resistor materials, where gate portions influence device operation by a voltage applied to the material or a current through the material.

Other examples can have the resistive memory material comprising simple or complex transition metal oxides (i.e. titanium, hafnium, tantalum, zirconium, tungsten, ruthenium, yttrium, scandium, cobalt, nickel, copper), perovskites, delafossites, or mixed oxides, including combinations thereof. Further example resistive memory materials can include ones formed with doped $CuInO_2$, Mott transition materials, or Schottky barrier materials. Other materials are possible, including combinations thereof.

Continuing with configuration 200 in FIG. 2, mask material 211 is applied to substrate 210 to form aperture 212. Although only a single aperture is shown in FIG. 2, a pattern of apertures and mask material can be formed by application of mask material 211 in further configurations to produce arrayed devices. Mask material 211 can be deposited onto substrate 210 to form aperture 212 that to form a resistive memory cell active zone in configuration 201. Mask material 211 can comprise photoresist material, silicon dioxide ($SiO_2$), or other suitable masking materials.

Once mask material 211 is applied, then configuration 201 illustrates introduction of reducing agent 230. Reducing agent 230 can comprise any chemical or material which reduces a level of chemical oxidation of substrate 210 or increases a level of chemical reduction of substrate 210. As seen in configuration 201, mask material 211 shields a portion of substrate 210 from reducing agent 230 and only aperture 212 is exposed to reducing agent 230. Reducing agent 230 chemically reduces substrate 210 to create active zone 213. Active zone 213 has resistive memory properties. Thus, the insulating or isolating properties of substrate 210 are changed for active zone 213 into resistive memory properties by chemical reduction of substrate 210.

Reducing agent 230 can comprise various agents. For example, hydrogen can be applied as reducing agent 230 in the form of a gas or plasma. Other examples employ ammonia or organic materials with reduction properties. Typically, substrate 210 is heated in the presence of reducing agent 230 and reducing agent 230 penetrates into substrate 210 around aperture 212 and chemically reduce a portion of substrate 210 by decreasing an oxidation level of substrate 210. In some examples, substrate 210 is immersed into a bath of gas, liquid, or plasma of reducing agent 230 and heated to produce active zone 213.

Reduction of substrate 210 can be achieved by different example processes than introduction of reducing agent 230. In a first example process, a metal compound or metal ions are introduced into substrate 210 through aperture 212 as reducing agent 230. This introduction can be of a similar metal or compound as comprises substrate 210, or can comprise different types metal or compounds. For example, when substrate 210 comprises a hafnium oxide material (i.e. $HfO_x$, where 'x' indicates a ratio of oxygen ions to hafnium ions), further Hf can be introduced into substrate 210 as shown for reducing agent 230. This further Hf can diffuse into substrate 210 through aperture 212, along with optional heating, and can reduce a relative level of oxygen in active zone 213. Thus, introduction of further Hf metal ions into substrate 210 active zone 213 can change a ratio of Hf-to-O in active zone 213 to reduce the relative level of oxygen. Similar processes can occur for different metal selections for substrate 210, and combination of different types of metal ions or compounds can be employed, such as when tantalum oxides or other metal oxides are employed for substrate 210.

In a second example process, a level of oxygen in active zone 213 can be reduced by diffusing a reactant into active zone 213 which extracts oxygen content. For example, substrate 210 immersed into reducing agent 230, along with optional heating, can remove oxygen from active zone 213. The oxygen ions in active zone 213 can be made to react with a suitable element or compound and then causes to be emitted from active zone 213, such as due to outgassing or diffusion. In a specific example, when a hydrogen or ammonia gas or plasma is employed as reducing agent 230, then oxygen in active zone 213 can react with the associated hydrogen to form water ($H_2O$) in the form of steam which is released from active zone 213. This process can reduce a relative level of oxygen in active zone 213 by introduction of a reactant, namely reducing agent 230.

Once the process described in configuration 201 is complete, reducing agent 230 has chemically modified substrate 210 using reducing agent 230 to create active zone 213. Substrate 210 can comprise a metal oxide material with an oxidation level above a predetermined threshold, and reducing agent 230 can reduce the level of oxidation of a portion of substrate 210 to form active zone 213. In some examples, the oxidation level of substrate 210 comprises a fully oxidized level, although variations are possible. The level of oxidation of substrate 210 is selected to ensure electrical isolation or electrical insulating properties are at or above desired levels, such as by ensuring a per-unit resistance of substrate 210 is above a threshold resistance level. Active zone 213 can comprise a partially-reduced semi-metallic material with resistive memory properties. The oxidation level of active zone 213 is selected to allow active zone 213 to exhibit resistive memory properties, and thus is at a higher oxidation level (or less-reduced level) than electrical terminals, such as electrodes 216-217 discussed in configuration 203, and a lower oxidation level than substrate 210. Configuration 202 illustrates mask material 211 removed, such as by chemical removal of photoresist, etching, or surface planarization, among other techniques.

Turning now to configuration 203 in FIGS. 3A, 3B creation of terminals is illustrated. Specifically, electrodes 216-217 are formed into substrate 210 as terminals for the associated memory device defined by active zone 213. It should be noted that electrodes 216-217 can be formed into substrate 210, active zone 213, or a combination thereof. As in configuration 200, mask material 214 is deposited which forms apertures 215 to define electrodes 216-217. Mask material 214 can comprise photoresist material, silicon dioxide ($SiO_2$), or other suitable masking materials.

Reducing agent 232 is applied which forms electrodes 216-217 into substrate 210 and potentially partially into active zone 213. As with reducing agent 230, an oxidation level of electrodes 216-217 is reduced using reducing agent 322. The relative level of oxygen to other metal ions/materials in electrodes 216-217 can be reduced using reducing agent 322 to increase a relative level of metal ions or extract oxygen content. Similar techniques and processes as described above for reducing agent 230 in configuration 201 of FIG. 2 can be employed in configuration 203 of FIG. 3. Configuration 204 illustrates mask material 214 removed, such as by chemical removal of photoresist, etching, or surface planarization, among other techniques.

In some examples, electrodes 216-217 comprise chemically reduced portions of substrate 210 that are reduced beyond a reduction level of active zone 213. Relative oxygen levels in electrodes 216-217 are reduced to below a threshold level to decrease an electrical resistance of electrodes 216-217 to below a threshold resistance level or to increase an electrical conductivity of electrodes 216-217 to above a conductivity threshold. As mentioned for configuration 201 above, a reduction in relative oxygen levels can be achieved by reacting oxygen in substrate 210 at electrodes 216-217 with a reactant which extracts oxygen from electrodes 216-217. This reduction in relative oxygen levels can also be achieved by introduction of further metal material into substrate 210 which reduces a ratio of metal-to-oxygen in substrate 210 at electrodes 216-217. Reducing agent 232 can be similar to or different than reducing agent 230. In some examples, electrodes 216-217 are transformed from the insulating/isolating state of metal oxide substrate 210 into having metallic properties of the associated metal.

In specific examples, such as when oxides of tantalum are employed for substrate 210, a first tantalum-to-oxygen ratio can be at 1:2 to achieve a low conductivity, high resistance material state for substrate 210. Electrodes 216-217 can be an altered version of substrate 210, with a tantalum-to-oxygen ratio of 1:1.6 to achieve a high conductivity, low resistance material state for electrodes 216-217. Active zone 213 can have a tantalum-to-oxygen ratio in between the ratio of substrate 210 and electrodes 216-217.

Configuration 205 of FIGS. 3A, 3B illustrates creation of an optional passivation layer into active zone 213. This passivation layer is referred to as isolation zone 219 in FIGS. 3A, 3B, and provides a layer of isolation between active zone 213 and further structures, metallization, contaminants, atmosphere, oxygen, or other materials, including combinations thereof. Alternative technique for surface passivation can be employed, and will be discussed below in FIG. 5.

Isolation zone 219 can comprise a surface oxidation which changes a surface layer of active zone 213 from the resistive memory state to a highly resistive state/low conductivity state. This highly resistive state can comprise a similar state as substrate 210, or can vary slightly. The state comprises an oxidation level of isolation zone 219, and this oxidation level can be returned to a level exhibited by substrate 210, but as mentioned above can vary in different examples. The oxidation level is established for isolation zone 219 as being a highly oxidized state, such as above a metal-to-oxygen ratio.

In operation, active zone 213 can be sensitive to a level of oxidation or reduction of active zone 213. Memory performance of active zone 213 can be negatively affected if oxidation or reduction levels of active zone 213 vary beyond desired limits. Isolation zone 219 reduces migration of oxygen ions into active zone 213. If oxygen ions migrate into active zone 213, unwanted or inadvertent conduction paths or conduction filaments can be formed which reduce operational efficiency of active zone 213 and any associated resistive memory device. In some examples, migration of oxygen ions into active zone 213 can cause the memory properties to fail into a constant memory state, such as to always indicate a particular bit or bits without regard to gate voltages applied to alter the memory state.

Oxidizing agent 233 can be employed to achieve this oxidation level, such as shown in FIGS. 3A, 3B. In operation 205, oxidizing agent 233 is introduced into active zone 213. Mask material 218 can be applied before application of oxidizing agent 233 to ensure oxidizing agent 233 is only applied to desired regions of active zone 213 and block from being applied to other portions of substrate 210 or electrodes 216-217. Mask material 218 can comprise photoresist material, silicon dioxide ($SiO_2$), or other suitable masking materials. Oxidizing agent 233 can comprise air at atmospheric pressure or other pressures, oxygen, hydrogen peroxide ($H_2O_2$), ozone ($O_3$), or other oxidizing agents, including combinations thereof. Oxidizing agent 233 can be presented to active zone 213 in a gas, liquid, or plasma state, among others, and heating can be applied in some examples. Once isolation zone 219 has been created, then mask material 218 can be removed, such as by chemical removal of photoresist, etching, or surface planarization, among other techniques.

FIG. 4 illustrates a memory cell with contacts applied and gate portions applied. Specifically, configuration 206 illustrates contacts 220-221 applied over electrodes 216-217. Contacts 220-221 can comprise metallization which electrically connects electrodes 216-217 to further metallization, circuitry, memory cells, or other elements. Contacts 220-221 can be deposited onto a surface of substrate 210. Contacts 220-221 can be formed by using various micro-manufacturing techniques, such as photo-lithography, deposition, epitaxial growth, etching, annealing, diffusion, ion implantation, and other techniques. As can be seen in FIG. 4, contacts 220-221 do not come in contact with active zone 213. Isolation zone 219 acts as a barrier or passivation layer which inhibits migration of metal ions or other contaminants from/through contacts 220-221 into active zone 213.

Gate 222 can comprise polycrystalline silicon or other materials, which allow a voltage to be applied to active zone 213 to control memory properties of active zone 213. Example control voltage VG 250 is shown in FIG. 4 as being applied to gate 222 and bulk 243, although other configurations are possible. In this example, gate 222 is formed onto gate isolation layer 223. In other examples, gate 222 is formed onto isolation zone 219 and gate isolation layer 223 is omitted. Gate isolation layer 223 can comprise $SiO_2$ or other dielectric material. Gate 222 and gate isolation layer 223 can each be deposited onto an associated surface, such as a surface of substrate 210. Gate 222 and gate isolation layer 223 can each be formed by using various micro-manufacturing techniques, such as photo-lithography, deposition, epitaxial growth, etching, annealing, diffusion, ion implantation, and other techniques. As can be seen in FIG. 4, gate 222 and gate isolation layer 223 do not come in contact with active zone 213. Isolation zone 219 acts as a barrier or passivation layer which inhibits migration of any materials or contaminants from/through gate 222 and gate isolation layer 223 into active zone 213.

As mentioned above, memory layers 209 can be formed on top of further layers. These layer can comprise additional memory layers or can instead comprise one or more layers of interconnect, logic, and associated substrates. In FIG. 4, memory layers 209 can be formed onto sublayers 208 comprising metallization layers 240, logic layers 241, and further substrates such as semiconductor substrate 242 which can comprise a semiconductor wafer or silicon wafer. In some examples, bulk 243 is considered part of memory layers 209, while in other examples bulk 243 is omitted or included in the sublayers. The logic and metallization layers can comprise semiconductor-based logic and metal interconnect of a logic circuit 252, processor 254, control system 256, or other elements which can at least control the elements of memory layers formed on top of the sublayers. For example, when a semiconductor wafer is employed for creation of logic circuitry and associated interconnect in layers 208, then resistive memory layers 209 can be formed on top of layers 208 using techniques described herein. One or more memory layers 209 can be built-up from layers 208 to form the memory cells or arrays as discussed herein. Substrate 210 comprises an insulating material which isolates individual memory cells of an array of memory cells from each other.

In FIG. 4, memory device 207 comprises a three-terminal memory device with a source (S), drain (D), and gate (G). An active channel is formed in substrate 210 and comprises active zone 213 which forms a memory cell. Gate 222 might comprise gate isolation 223 to form a rectifying junction with the material of active zone 213, which isolates the gate and acts as a selector. The gate material can comprise n-type semiconductor, such as an n-type polycrystalline silicon material. The active zone 213 can form a PN rectifying junction or 'diode' configuration from active zone-to-gate. PN junctions can be fabricated not only from classical semiconductors, but also from the metal oxide materials discussed herein. When PN junctions are employed, a resistance level can be measured through the gate associated with a memory device, as current can flow from the resistive memory material of the active channel through the gate, but not in reverse due to the PN junction. In other examples, no PN rectifying junction is formed between gate and channel. In this case, the gate is not electrically isolated from the active channel, and resistance values for a memory cell can be measured from gate-to-active channel.

In a non-memory, semiconductor, field-effect transistors (FETs), such as junction field-effect transistors (JFETs), voltages applied to gate elements control current flow between source and drain, but only when a gate voltage is applied. In these non-memory FET devices, when the gate voltage is removed, then behavior between the source and drain returns to an inactive state. Thus, a non-memory FET can be considered a voltage controlled resistor. In the resistive memory devices herein, such as shown in device 207, a structure similar to a FET is shown. However instead of being a voltage controlled resistor in FET examples, device 207 acts as a flux linkage controlled resistor.

Figure 5:
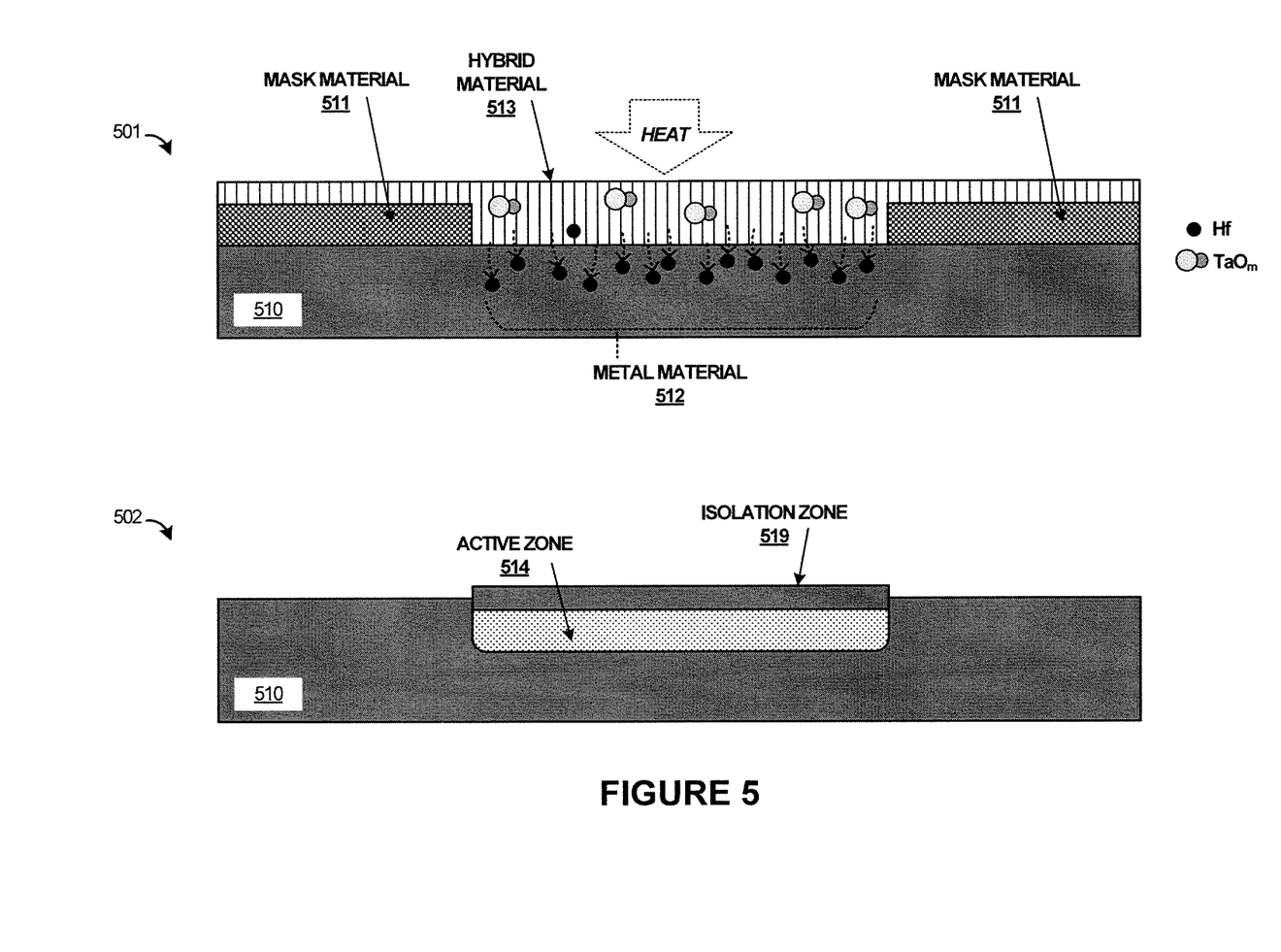
FIG. 5 illustrates manufacture of resistive memory elements.

FIG. 5 illustrates a cross-sectional side view of an alternative manufacturing process for forming an active zone and isolation zone. In FIG. 5, configuration 501 shows substrate 510 (similar to substrate 210 above) having mask material 511 applied to form an aperture which will define a resistive memory cell. Hybrid material 513 is then layered onto the aperture and mask material 511. Hybrid material can comprise a combination of one or more metals and oxides, such as hafnium (Hf) doped tantalum (Ta) oxide, although any suitable material or combination listed herein can be employed. Heat is applied to configuration 501. Hf ions will migrate as metal material 512 into substrate 510, and tantalum oxide material will remain in hybrid material 513, with possible trace remnants of hafnium which did not migrate into substrate 510. Hf will act as a reducing agent in substrate 510 by increase a relative ratio of substrate metal ions to oxygen in substrate 510. For example, when substrate 510 initially comprises hafnium and oxygen at a first ratio, then after application of hybrid material 513 and heat, the additional hafnium introduced into a zone of substrate 510 will increase a quantity of metal ions to oxygen. This transforms a portion of substrate 510 into active zone 514 shown in configuration 502. Concurrently, isolation zone 519 is formed which isolates or passivates a layer of active zone 514 to protect active zone 514 from contaminants, metal ion migration, further oxidation, or other chemical transformations. Configuration 502 illustrates mask material 511 removed, such as by chemical removal of photoresist, etching, or surface planarization, among other techniques. Active zone 514 can then be employed in a memory device, such as memory device 207 in FIG. 4 which includes electrodes, contacts, gates, gate isolation, and other features. These features can be formed as discussed herein.

Although the examples herein generally discuss active regions and terminals formed by chemical reduction of a substrate, it should be understood that devices can be formed by either chemical reduction or chemical oxidation of a substrate. The chemical oxidation versions can describe an inverse configuration of the examples in FIG. 2-5. Specifically, a portion of a substrate can be chemically oxidized to form an active region in the substrate. The active region is formed to have resistance properties that can be modified to store one or more data bits in the active region. The active region can comprise a region of the substrate with a chemically altered oxidation level to establish a resistive memory property in the substrate. Terminals for the active region can be formed by chemically oxidizing the substrate to a lesser degree (or increasing a reduction level) than the active region to form conductive regions in the substrate. The terminals can comprise a region of the substrate with a chemically altered oxidation level to establish a conductive property in the substrate. The substrate, in this inverse example, can comprise an initially chemically reduced layer of material, and the oxidation level of the substrate is altered to establish the active region and the terminals. Materials described herein (metal oxides, perovskite materials, or delafossite materials) can be employed in the 'inverse' devices discussed above.

Stated another way, a substrate can have an oxidation level or a reduction level chemically altered to form the active region and terminals. The oxidation levels or reduction levels of a substrate can be altered (increased or decreased) to produce a desired material property to establish the resistive and electrical properties of the active region and terminals. In examples where the substrate is initially in a reduced state, the substrate can comprise a sub-stoichiometric film which has a reduction level or oxidation level chemically altered to form the active region and terminals.

In yet further examples, the substrate can be formed to initially have resistive memory properties, such as by establishing a reduction or oxidation level of a material from which the substrate is formed or forming the substrate from an already-reduced material. Individual active regions of memory cells, can be formed by chemically oxidizing regions of the substrate between other regions that will form the active regions. This oxidation will inactivate the resistive memory properties and allow for isolation of each of the active regions from each other. Terminals can be formed by establishing a conductive property at ends of each active region by chemically reducing associated portions of the substrate beyond a reduction level established for the active regions.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A resistive memory device, comprising:
    a substrate comprised of a metal oxide material, wherein the substrate has a first surface and a second surface opposite the first surface;
    an active region having resistance properties that can be modified to store one or more data bits, the active region comprising a region of the substrate with a chemically altered reduction level to establish a resistive memory property in the substrate, the active region in direct contact with the substrate, wherein the active region has a third surface and a fourth surface opposite the third surface;
    an isolation zone coupled to the active region, wherein the isolation zone has a fifth surface in contact with the fourth surface and a sixth surface opposite the fifth surface, wherein the isolation zone is oxidized; and
    terminals configured to couple the active region to associated electrical contacts, wherein the terminals comprise a source electrode and a drain electrode, wherein the source electrode has a seventh surface and an eighth surface opposite the seventh surface, wherein the drain electrode has a ninth surface and a tenth surface opposite the ninth surface, and wherein the tenth surface, the eighth surface and the sixth surface are coplanar.

2. The resistive memory device of claim 1, wherein the terminals each comprise a region of the substrate chemically reduced to a greater reduction level than the active region to establish the conductive property in the substrate.

3. The resistive memory device of claim 1,
    wherein the isolation zone is configured to inhibit migration of contaminants into a surface of the active region, and the isolation zone comprises a chemically oxidized layer of the active region.

4. The resistive memory device of claim 3, comprising:
    a gate portion positioned over the active region and configured to modify the resistance properties of the active region responsive to voltages applied to the gate portion, wherein the gate portion is positioned on at least one of the isolation zone and a gate oxide layer formed on top of the isolation zone.

5. The resistive memory device of claim 1, wherein the metal oxide material of the substrate comprises at least one of an oxide of titanium, oxide of hafnium, oxide of tantalum, oxide of zirconium, oxide of tungsten, oxide of ruthenium, oxide of yttrium, oxide of scandium, oxide of cobalt, oxide of nickel, oxide of copper, perovskite material, and delafossite material.

6. The resistive memory device of claim 1, comprising:
    a semiconductor sublayer on which the substrate is layered, the semiconductor sublayer comprising logic circuitry configured to control at least the resistive memory device.

* * * * *